United States Patent [19]
Kawamoto et al.

[11] Patent Number: 5,621,231
[45] Date of Patent: Apr. 15, 1997

[54] SOLID-STATE IMAGER

[75] Inventors: Seiichi Kawamoto; Tadakuni Narabu, both of Kanagawa, Japan

[73] Assignee: Sony Corporation, Tokyo, Japan

[21] Appl. No.: 683,865

[22] Filed: Jul. 19, 1996

Related U.S. Application Data

[63] Continuation of Ser. No. 493,861, Jun. 23, 1995, abandoned, which is a continuation of Ser. No. 113,911, Aug. 31, 1993, abandoned.

[30] Foreign Application Priority Data

Sep. 7, 1992 [JP] Japan .................................. 4-265398

[51] Int. Cl.$^6$ .......................... H01L 27/148; H01L 29/768
[52] U.S. Cl. ............................................ 257/223; 257/222
[58] Field of Search ..................................... 257/223, 222

[56] References Cited

U.S. PATENT DOCUMENTS

| | | | |
|---|---|---|---|
| 3,896,485 | 7/1975 | Early | 257/223 |
| 4,362,575 | 12/1982 | Wallace | 257/223 |
| 4,527,182 | 7/1985 | Ishihara | 257/223 |
| 5,276,520 | 1/1994 | Hawkins et al. | 257/223 |

*Primary Examiner*—Mahshid D. Saadat
*Assistant Examiner*—S. V. Clark
*Attorney, Agent, or Firm*—Hill, Steadman & Simpson

[57] ABSTRACT

There is disclosed a solid-state imager for preventing an unwanted potential barrier in the overflow control gate when ions are implanted into the sensor portion. The imager is capable of easily controlling the amount of overflow. The sensor portion takes the hole accumulation diode (HAD) sensor structure. A potential barrier is created in the overflow control gate by ion implantation. A potential difference created between the overflow control gate and the sensor portion is determined by the amount of ions implanted. A DC voltage $V_D$ applied to the overflow drain is variable. The potential difference is adjusted by varying the DC voltage $V_D$. Thus, elements of the imager are uniform in potential barrier.

12 Claims, 5 Drawing Sheets

SOLID-STATE IMAGER

This is a continuation, of application Ser. No. 08/493,861, filed Jun. 23, 1995 now abandoned, which is a continuation of application Ser. No. 08/113,911 filed Aug. 31,1993 now abandoned.

FIELD OF THE INVENTION

The present invention relates to a solid-state imager and, more particularly, to a solid-state imager having a so-called horizontal overflow drain structure.

BACKGROUND OF THE INVENTION

A known solid-state imager of this kind is shown in FIG. 1, where an N-type doped region 17, or a P-well, is formed on an N-type silicon substrate 16. This imager has a sensor portion 2 having a charge storage layer 13 consisting of an $N^+$-type doped region. A positive hole storage region 12 consisting of a $P^+$-type doped region is formed on the charge storage layer 13. This is known as a hole accumulation diode (HAD) sensor structure.

An overflow control gate (OFCG) 4 consisting of an N-type doped region is formed adjacent to the sensor portion 2. An overflow drain (OFD) 8 consisting of an $N^+$-type doped region is formed adjacent to the overflow control gate 4.

An insulating layer (not shown) is formed on the overflow control gate 4. A gate electrode 15 made of polysilicon is formed on the insulating layer. A given DC voltage $V_G$ is applied to the gate electrode 15 to create a potential barrier.

If electric charge is accumulated in the sensor portion 2 by photoelectric conversion, that portion of the accumulated charge which exceeds the potential barrier of the overflow control gate 4 flows out into the overflow drain 8 and is then expelled through the drain 8.

The output voltage-incident light quantity characteristic of the solid-state imager having the above-described overflow drain structure is shown in FIG. 2. As can be seen from this, the characteristic exhibits a logarithmic property after an overflow point has been exceeded.

In the conventional solid-state imager having this horizontal overflow drain structure, a potential barrier is created in the overflow control gate 4 by providing the gate electrode 15 and applying a DC voltage $V_G$ to this gate electrode.

Especially, in the solid-state imager having the sensor portion 2 of the HAD sensor structure, when the positive hole storage layer 12 is formed, the gate electrode 15 on the overflow control gate 4 is used as a mask, and ions are injected such that the positive hole storage layer 12 is formed on the overflow control gate 4 by self-aligning techniques, as shown in FIG. 3.

However, the $P^+$-type impurity which is implanted, using the gate electrode 15 as a mask, is diffused in a thermal diffusion step or the like after the ion implantation step. Consequently, the impurity gets under the gate electrode 15, as shown in FIG. 3.

Thus, the positive storage layer 12 is clamped at ground level and acts as a virtual electrode. As shown in the potential diagram of FIG. 4, a barrier is created at an edge of the overflow control gate 4 where a $P^+$-type impurity has been diffused. As a result, an unwanted potential barrier is produced.

This unwanted potential barrier is varied, depending on the state of the polysilicon forming the gate electrode 15, on the manner in which the $P^+$-type impurity has been diffused, and on other factors. This produces variations among states of elements. In this way, the presence of the unwanted potential barrier makes it difficult to control the amount of overflow.

SUMMARY OF THE INVENTION

It is an object of the present invention to provide a solid-state imager in which any unwanted potential barrier is not created in the overflow control gate when ions are implanted into the sensor portion, whereby the amount of overflow can be controlled easily.

A solid-state imager according to the invention comprises a sensor portion for storing electric charge produced in response to incident light, an overflow drain formed adjacent to the sensor portion, and an overflow control gate for transferring the charge stored in the sensor portion to the overflow drain. A potential barrier is created in the overflow control gate by implanting ions into its gate region. The DC voltage applied to the overflow drain is variable.

The potential barrier in the overflow control gate is created not by applying a DC voltage to the gate electrode but by implanting ions into its gate region. This eliminates the prior art step of implanting ions into the sensor portion, using the gate electrode as a mask. An unwanted potential barrier which would otherwise be produced in the overflow control gate due to diffusion of implanted impurity ions is prevented.

An initial potential difference produced between the sensor portion and the potential barrier created by the ion implantation is determined by the dose, or the amount of ions implanted. This initial potential difference is adjusted by varying the DC voltage applied to the overflow drain and utilizing the two-dimensional effect of the overflow drain.

Other objects and features of the invention will appear in the course of the description thereof, which follows.

DESCRIPTION OF THE PREFERRED EMBODIMENTS

Figure 5:
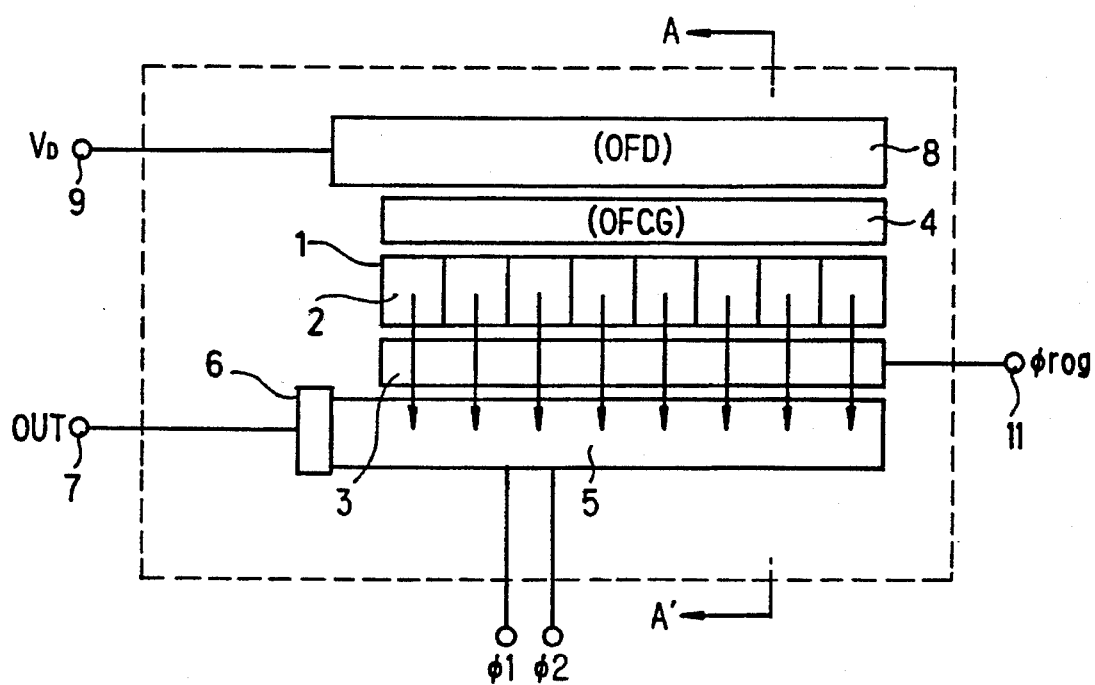
FIG. 5 is a diagram of a linear sensor having a horizontal overflow drain structure.

FIG. 5 shows the structure of a linear sensor according to the invention. This linear sensor comprises a sensor array 1 made up of individual sensor elements 2, a reading gate 3, an overflow control gate 4, and channel stoppers 14 (FIGS. 6(a) and 6(b)) for isolating the individual sensor elements from each other. Signal charges produced by photoelectric conversion at the individual sensor elements 2 of the sensor array 1 are stored in regions surrounded by the reading gate 3, the overflow control gate 4, and the channel stoppers 14.

Electric charge stored in each individual sensor element 2 of the sensor array 1 is transferred to a charge transfer path 5 via the reading gate 3 in response to reading pulses $\Phi_{rog}$ applied from a gate terminal 11. The charge transfer path 5 consists of a shift register. For example, charges are successively transferred through the path 5 in response to two-phase clock pulses $\Phi 1$ and $\Phi 2$.

An output portion 6 composed of a floating diffusion amplifier, for example, is provided at the output terminal of the charge transfer path 5. Charges transferred to the output portion 6 are converted into voltages at this output portion 6 and taken out from an output terminal 7.

An overflow drain 8 is disposed on the opposite side of the sensor array 1 from the charge transfer path 5 to form a horizontal overflow drain. This overflow drain 8 has a reduced electrical resistance. A DC voltage $V_D$ is applied via a drain terminal 9 such that the potential at the overflow drain 8 is deeper than the potential in each sensor element 2.

When electric charge is accumulated at each sensor element 2 by photoelectric conversion, the portion of the accumulated charge exceeding the potential barrier of the overflow control gate 4 is transferred to the overflow drain 8.

Figure 6A:
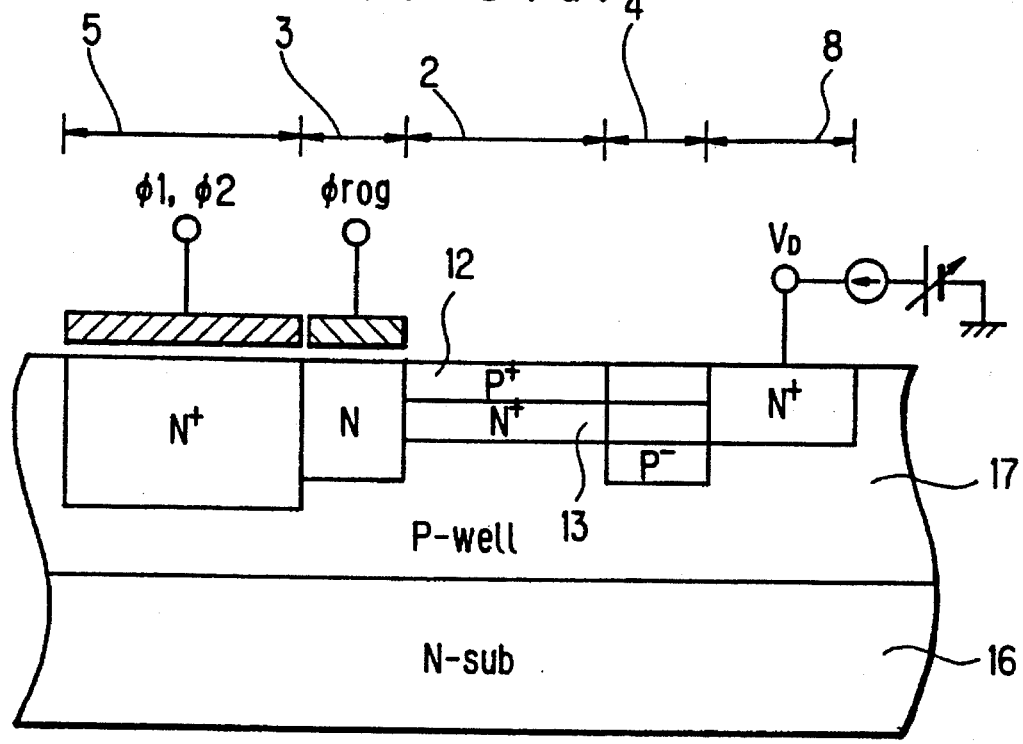
FIG. 6(a) is a cross-sectional view taken along line A-A' of FIG. 5.
Figure 6B:
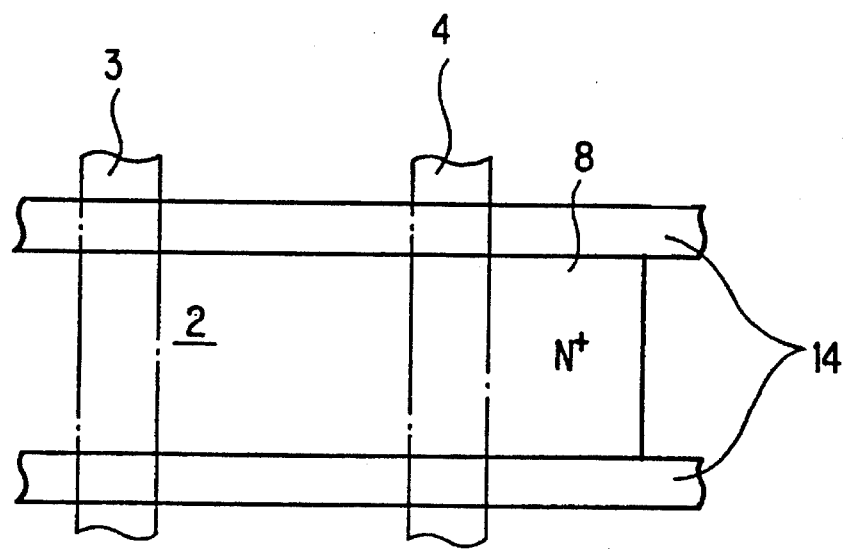
FIG. 6(b) is a diagram illustrating the two-dimensional pattern of main portions of the sensor shown in FIG. 5.

FIG. 6(a) is a cross-sectional view taken on line A-A' of FIG. 5. FIG. 6(b) shows the two-dimensional pattern of main portions of the linear sensor shown in FIG. 6(a). In FIG. 6(a), each sensor element 2 has a HAD sensor structure. In particular, each sensor element 2 comprises a charge storage layer 13 for storing electric charge generated in response to incident light and a positive hole storage layer 12 formed on the charge storage layer 13 to improve the sensitivity and to suppress the surface dark current. The charge storage layer 13 is formed by implanting $N^+$-type impurity ions. The positive hole storage layer 12 is formed by injecting $P^+$-type impurity ions. In this sensor element 2 of the HAD sensor structure, an N-type semiconductor layer consisting of the charge storage layer 13 cooperates with a P-type semiconductor layer 17, or a P-well, to form a photodiode for performing photoelectric conversion.

Those regions which are implanted with ions to form the charge storage layer 13 and the positive hole storage layer 12 and correspond to the overflow control gate 4 adjacent to the sensor element 2 are further implanted with $P^-$-type impurity ions.

Figure 7:
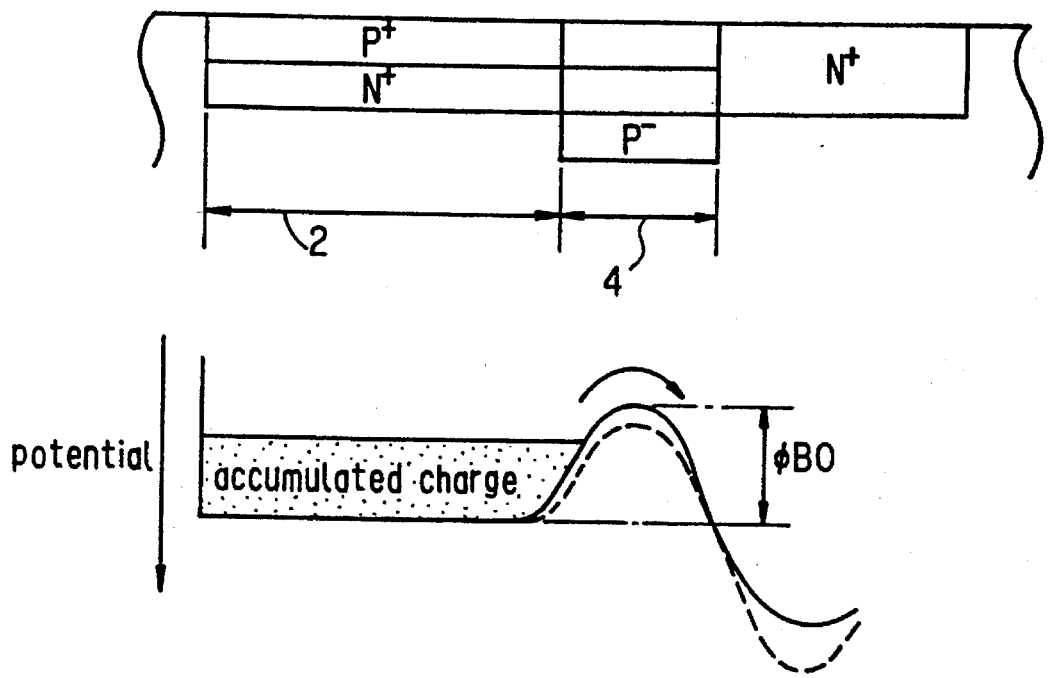
FIG. 7 is a diagram illustrating the potential in the sensor portion and in the overflow control gate of a solid-state imager according to the invention.
Figure 8:
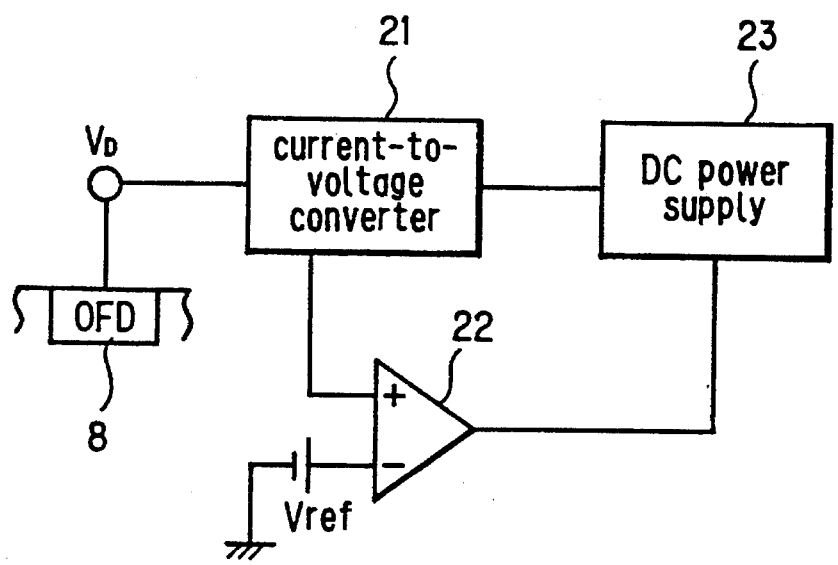
FIG. 8 is a diagram of a circuit for adjusting a DC voltage $V_D$ applied to an overflow drain.

This ion implantation creates a potential barrier having an appropriate potential difference $\Phi_{BO}$ with the sensor element 2, as shown in FIG. 7. An initial potential difference $\Phi_{BO}$ due to this potential barrier is determined by the dose, or the amount of implanted ions.

The DC voltage $V_D$ applied to the overflow drain 8 is variable. As indicated by the broken line in FIG. 7, the potential barrier in the overflow control gate 4 is varied under the influence of variations in the potential at the overflow drain 8 when the DC voltage $V_D$ is changed. Therefore, the initial potential difference $\Phi_{BO}$ created between the sensor element 2 and the overflow control gate 4 can be adjusted by the two-dimensional effect of the overflow drain 8.

When this DC voltage $V_D$ is adjusted, an electrical current flowing into the overflow drain 8 is monitored and converted into a voltage by a current-to-voltage conversion circuit 21. The obtained voltage is compared with a given reference voltage $V_{ref}$ by a comparator 22. A DC power supply 23 is controlled according to the output from the comparator 22. In this structure, the DC voltage $V_D$ can be adjusted automatically in such a way that the electrical current value flowing into the overflow drain 8 becomes a predetermined value dictated by the reference voltage $V_{ref}$.

Figure 1:
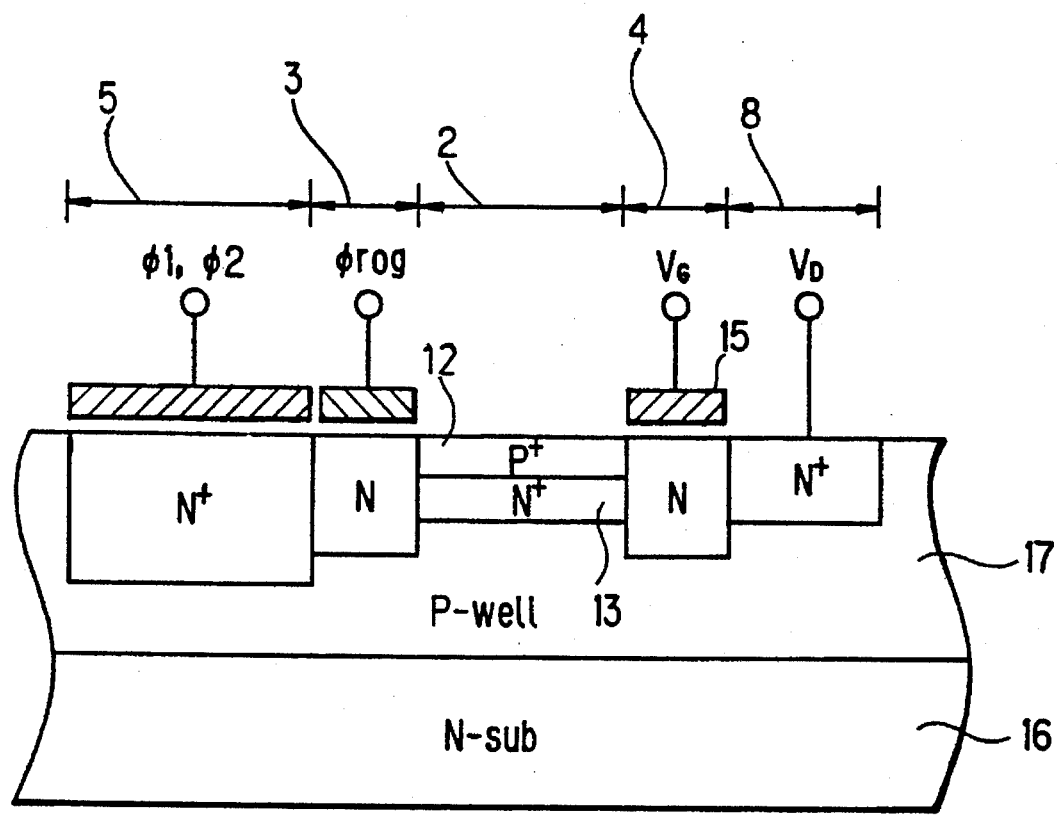
FIG. 1 is a cross-sectional view of the prior art solid-state imager.

AS mentioned previously, in the past, the potential barrier in the overflow control gate 4 has been formed by applying a DC voltage $V_G$ to the gate electrode 15 (FIG. 1). In the present invention, this potential barrier is created by ion implantation. Therefore, the initial potential difference $\Phi_{BO}$ can be determined by the dosage, or the amount of implanted ions. Hence, the gate electrode 15 can be dispensed with. This eliminates the step of implanting ions into the sensor element 2, using the gate electrode 15 as a mask. Consequently, it is unlikely that an unwanted potential barrier is produced between the sensor element 2 and the overflow control gate 4 due to the presence of the gate electrode 15 as in the prior art techniques.

Figure 2:
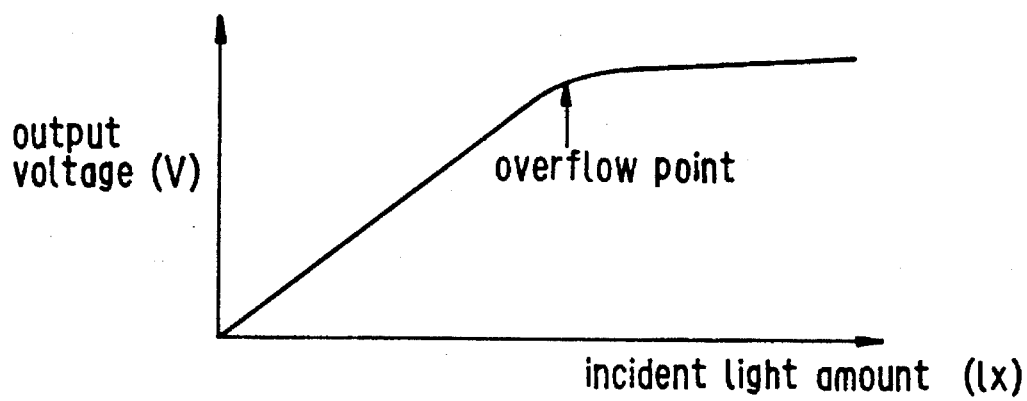
FIG. 2 is a graph illustrating the output voltage-incident light quantity characteristic of an overflow drain structure.
Figure 3:
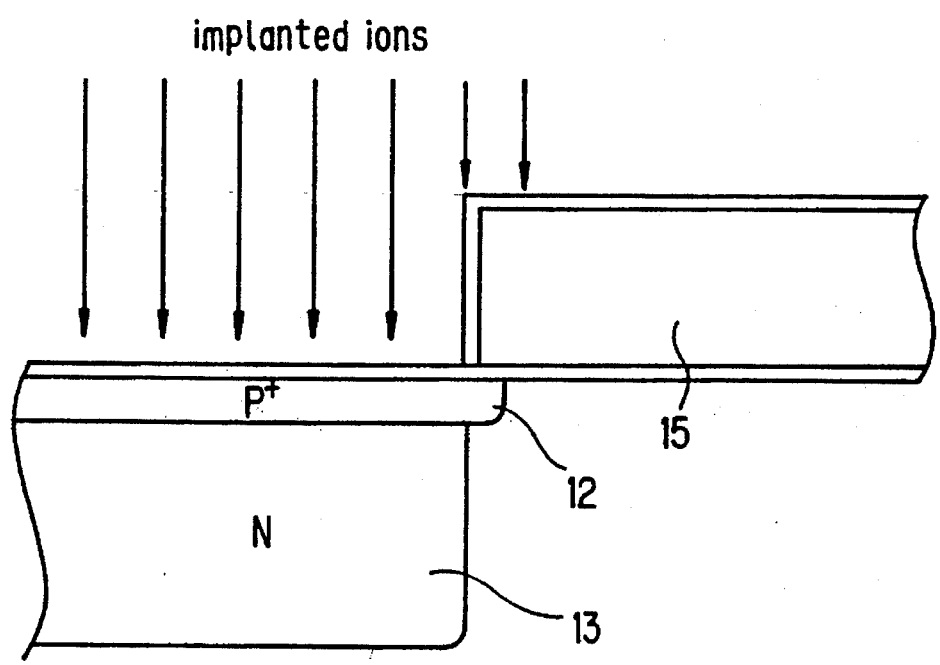
FIG. 3 is a cross-sectional view illustrating an ion implantation step used to fabricate a HAD sensor structure.
Figure 4:
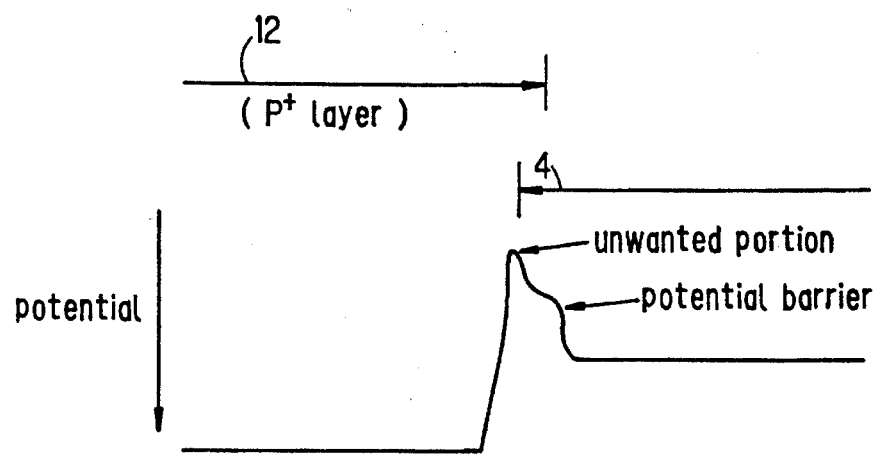
FIG. 4 is a diagram illustrating the potential in the sensor portion and in the overflow control gate of the prior art solid-state imager.

Also, the initial potential difference $\Phi_{BO}$ produced between the sensor element 2 and the overflow control gate 4 can be adjusted because the DC voltage $V_D$ applied to the overflow drain 8 is variable. Therefore, even if elements differ in initial potential difference $\Phi_{BO}$ due to variations in process conditions, the differences can be absorbed. Furthermore, the amount of overflow determined by the potential difference $\Phi_{BO}$ can be easily controlled. Especially, in a linear sensor having a logarithmic characteristic, the illumination (the overflow point in FIG. 2) giving a logarithmic characteristic can be adjusted by varying the DC voltage $V_D$.

In the above embodiment, the present invention is applied to a solid-state imager having the HAD sensor structure. In solid-state imagers not assuming the HAD sensor structure, the potential barrier at the overflow control gate may be formed by ion implantation, and the DC voltage $V_D$ applied to the overflow drain may be variable.

As described in detail thus far, in the novel solid-state imager, especially in solid-state imagers having sensor portions of the HAD sensor structure, the potential barrier in the overflow control gate is created by ion implantation. Thus, the potential difference produced with the sensor portion is determined by the dosage, or the amount of ions implanted. This eliminates a gate electrode which would have been required heretofore. Concomitantly, an unwanted potential barrier in the overflow control gate can be prevented.

In addition, the initial potential difference produced between the sensor portion and the overflow control gate can be adjusted because the DC voltage applied to the overflow drain is variable, the initial potential difference being determined by the dosage. In consequence, elements which are uniform in potential barrier can be fabricated. Hence, the amount of overflow can be controlled easily. Moreover, the amount of charge stored in the sensor portion can be controlled.

What is claimed is:

1. A solid-state imager comprising:
   a semiconductor body of first conductivity type;
   a first region having second conductivity type impurities, said first region formed on said semiconductor body and serving as a charge storage layer;
   a second region having first conductivity type impurities, said second region substantially overlying said first region, wherein a concentration of said first conductivity type impurities in said second region is higher than that of said semiconductor body;

a third region having second conductivity type impurities, said third region formed adjacent to said first region and serving as an overflow drain;

a fourth region adjacent said third region having a first conductivity type impurities formed in a portion of said first region overlaid by said second region thereby to create a potential barrier and serving as an overflow barrier.

2. A solid-state image according to claim 1, wherein said first conductivity type is P type and said second region serves as a hole storage layer.

3. A solid-stage imager according to claim 1, wherein said third region is connected to a variable voltage source and said potential barrier in said fourth region can be varied by controlling a voltage of said variable voltage source.

4. A solid-state imager according to claim 1, wherein said second region contacts said third region.

5. A solid-state imager according to claim 4, wherein said fourth region contacts said third region.

6. A solid-state imager according to claim 3, wherein said voltage of said voltage source is set according to an electrical current flowing into said third region.

7. A solid-stage imager comprising:

a semiconductor body of first conductivity type;

a first region having second conductivity type impurities, said first region formed on said semiconductor body and serving as a charge storage layer;

a second region having first conductivity impurities, said second region substantially overlying said first region;

a third region having second conductivity type impurities, said third region formed adjacent to said first and second region and serving as an overflow drain;

a fourth region adjacent said third region having a first conductivity type impurities formed in a portion of said first region adjacent to said third region to create a potential barrier and serving as an overflow barrier.

8. A solid-state imager according to claim 7, wherein said first conductivity type is P type and said second region serves as a hole storage layer.

9. A solid-state imager according to claim 7, wherein said third region is connected to a variable voltage source and said potential barrier in said fourth region can be varied by controlling a voltage of said variable voltage source.

10. A solid-state imager according to claim 7, wherein said second region contacts said third region.

11. A solid-stage imager according to claim 8, wherein said fourth region contacts said third region.

12. A solid-state imager according to claim 7, wherein said voltage of said voltage source is set according to electrical current flowing into said third region.

* * * * *